United States Patent
Chou et al.

(10) Patent No.: US 9,385,735 B2
(45) Date of Patent: Jul. 5, 2016

(54) ANALOG-TO-DIGITAL CONVERTER FOR IMAGE PIXELS

(71) Applicant: Taiwan Semiconductor Manufacturing Company Limited, Hsin-Chu (TW)

(72) Inventors: Kuo-Yu Chou, Hsinchu (TW); Shang-Fu Yeh, Hsinchu (TW); Wei Lun Tao, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 112 days.

(21) Appl. No.: 14/496,029

(22) Filed: Sep. 25, 2014

(65) Prior Publication Data
US 2016/0094234 A1    Mar. 31, 2016

(51) Int. Cl.
| | |
|---|---|
| H03M 1/56 | (2006.01) |
| H03M 1/00 | (2006.01) |
| H04N 5/3745 | (2011.01) |
| H03M 1/34 | (2006.01) |
| H03M 1/06 | (2006.01) |
| H04N 5/378 | (2011.01) |

(52) U.S. Cl.
CPC ............ *H03M 1/002* (2013.01); *H03M 1/0607* (2013.01); *H03M 1/34* (2013.01); *H04N 5/378* (2013.01); *H04N 5/37455* (2013.01)

(58) Field of Classification Search
CPC ..... H03M 1/002; H03M 1/0607; H03M 1/34; H04N 5/378
See application file for complete search history.

(56) References Cited

U.S. PATENT DOCUMENTS

| | | | |
|---|---|---|---|
| 7,924,207 B2 | 4/2011 | Snoeij et al. | |
| 8,643,750 B2 | 2/2014 | Mo et al. | |
| 8,816,893 B1* | 8/2014 | Yang | H04N 5/335 341/169 |
| 2012/0039548 A1* | 2/2012 | Wang | H03M 1/1009 382/312 |

OTHER PUBLICATIONS

Multiple-Ramp Column-Parallel ADC Architectures for CMOS Image Sensors, IEEE Journal of Solid-State Circuits, vol. 42, No. 12, Dec. 2007, pp. 2968-2977, Martijn F. Snoeij et al.
Power and Area Efficient Column-Parallel ADC Architectures for CMOS Image Sensors, IEEE Sensors 2007 Conference, pp. 523-526, Martijn F. Snoeij et al.

* cited by examiner

*Primary Examiner* — Tony Ko
(74) *Attorney, Agent, or Firm* — Cooper Legal Group, LLC

(57) ABSTRACT

One or more analog-to-digital converters and methods for analog-to-digital conversion are provided. The analog-to-digital converter comprises a ramp generator and a direct current (DC) generator respectively configured to apply a ramp voltage waveform and a DC voltage waveform to a comparator. During a pixel signal level conversion, a first portion of the ramp voltage waveform is applied to the comparator. A control circuit then makes a determination regarding an output of the comparator. If the output corresponds to a first output, or first logic state, the ramp voltage generator applies a second portion of the ramp voltage waveform to the comparator. If the output corresponds to a second output, or second logic state, the DC generator adjusts the DC voltage waveform applied to the comparator.

20 Claims, 13 Drawing Sheets

ANALOG-TO-DIGITAL CONVERTER FOR IMAGE PIXELS

BACKGROUND

Cameras and other wavelength-sensing devices use image pixels, such as complementary metal-oxide semiconductors, to detect wavelengths within a given wavelength spectrum. A voltage response of an image pixel is a function of the detected wavelength. For example, an image pixel detecting no visible light generates a voltage waveform that is different than a voltage waveform generated by the image pixel when exposed to white light. An analog-to-digital converter (ADC) is configured to convert voltage waveforms output by one or more image pixels into a digital domain.

One architecture of an ADC is a single slope ADC. In a single slope ADC, a ramp generator is configured to generate a substantially linear ramp signal that is compared to a voltage waveform output from an image pixel. The time it takes for the linear ramp signal to exceed the voltage waveform output from the image pixel is measured via a digital counter. A number of clock cycles that are counted by the digital counter during the time is used to derive a digital output that is equivalent to the voltage waveform, thereby converting the voltage waveform to the digital domain. A disadvantage of the single slope ADC architecture is the relatively long length of time it takes to perform an analog-to-digital conversion due to the linear nature of the ramp signal, resulting in high power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
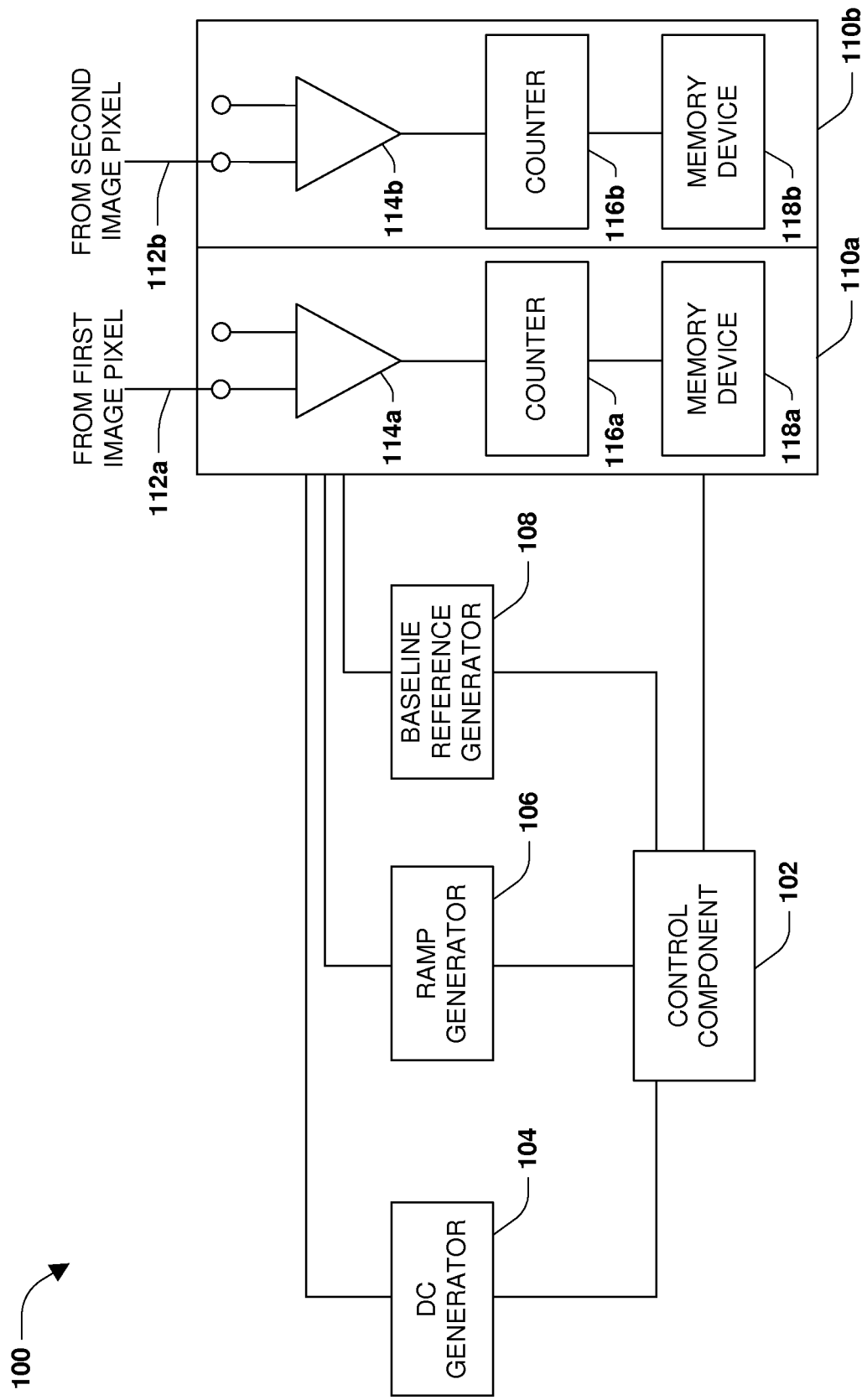
FIG. 1 is a component block diagram of an example analog-to-digital converter, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

According to some embodiments, an analog-to-digital converter (ADC) having a reduced analog-to-digital conversion time and thus reduced power consumption relative to a conventional single slope ADC is provided. In some embodiments, the ADC is implemented with a complementary metal-oxide semiconductor (CMOS) image sensor comprising a plurality of CMOS image pixels arranged in an image array. The CMOS image sensor also comprises readout circuitry, which includes the ADC in some embodiments.

The ADC is coupled to a set of one or more image pixels of the image array and is configured to convert voltage waveforms output by the set of image pixels into a digital domain, such as where a first image pixel of the set outputs a first voltage waveform, a second image pixel of the set outputs a second voltage waveform, etc. To perform such a conversion, an output terminal of the set of image pixels is coupled to an input of a comparator of the ADC. The comparator receives a voltage waveform output by an image pixel of the set and compares the voltage waveform to a reference voltage waveform. As further described with respect to FIGS. 2, 5, and 8, the reference voltage waveform is a function of at least one of a ramp voltage waveform, a baseline reference voltage waveform, or a direct current (DC) voltage waveform.

According to some embodiments, to convert the voltage waveform to the digital domain, a first portion of the ramp voltage waveform is applied to the comparator. Depending upon an output of the comparator after the first portion of the ramp voltage waveform has been applied to the comparator, a control component determines whether to adjust a voltage of the DC voltage waveform applied to the comparator. For example, where the output of the comparator does not change after application of the first portion of the ramp voltage waveform, the control component initiates adjusting the voltage of the DC voltage waveform, such as stepping up or stepping down the voltage of the DC voltage waveform. Where the output of the comparator changes after application of the first portion of the ramp voltage waveform, the control component maintains the voltage of the DC voltage waveform at a level applied during application of the first portion of the ramp voltage.

As described further below, stepping up or stepping down the voltage of the DC voltage waveform rapidly increases or decreases the voltage applied to a terminal of the comparator, which decreases an analog-to-digital conversion time and thus reduces power consumption relative to a conventional single slope ADC, for example.

Referring to FIG. 1, a component block diagram of an example ADC 100, in accordance with some embodiments, is provided. The ADC 100 comprises a control component 102, a DC generator 104, a ramp generator 106, a baseline reference generator 108, and a set of one or more readout circuits 110, such as 110a-b. Respective readout circuits 110 are coupled to one or more image pixels of an image array via a readout line 112, such as 112a-b, which is also referred to as a bit line. In the some embodiments, a readout line 112 is coupled to a column of image pixels within the image array and a readout circuit 110, coupled to the readout line 112, is configured to receive and process voltage waveforms output by the column of image pixels, although other configurations are contemplated, such as where a readout line is coupled to a row of image pixels, coupled to merely a portion of image pixels arranged in a column, etc.

The control component 102 is configured to initiate a pixel reset level conversion and to initiate a pixel signal level conversion within the example ADC 100. A pixel reset level conversion is configured to measure a voltage level on the readout line 112 after a reset voltage has been applied to an image pixel. The pixel signal level conversion is configured to measure a voltage level on the readout line 112 when image data from the image pixel is transferred to the readout line 112 for conversion from an analog domain to a digital domain. In some embodiments, a measurement acquired during the pixel reset level conversion is subtracted from a measurement acquired during the pixel signal level conversion to determine a digital value corresponding to an amount of light sensed by the image pixel during a readout period.

In some embodiments, the control component 102 is further configured to control application of at least one of a ramp voltage waveform generated by the ramp generator 106 or a DC voltage waveform generated by the DC generator 104 to the readout circuit 110. For example, the control component 102 is configured to receive an output of one or more comparators 114, such as 114a-b, of respective readout circuits 110, and to initiate application of the ramp voltage waveform or initiate an adjustment of the DC voltage waveform to an input of the one or more comparators 114 based upon the output.

The DC generator 104 is configured to adjust a voltage of a DC voltage waveform applied, at times, to one or more of the readout circuits 110. As opposed to the ramp voltage waveform, which has a voltage that varies over time, the DC voltage waveform has a substantially constant voltage over time unless stepped up or stepped down. As will be further described with respect to FIG. 4, the voltage of DC voltage waveform that is applied to a readout circuit 110 is a function of the output of one or more comparators 114 during a pixel signal level conversion.

Figure 2:
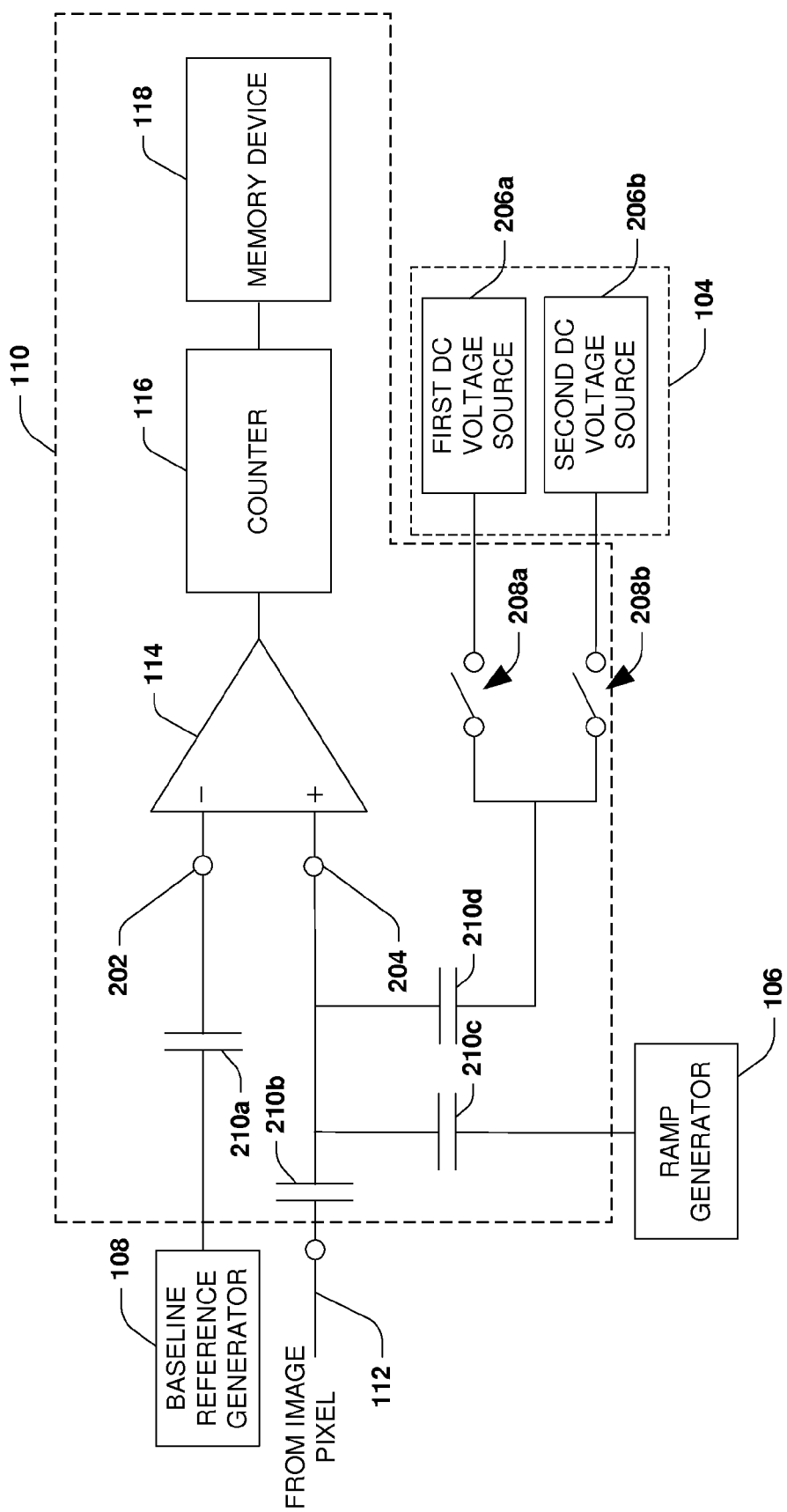
FIG. 2 is a partial schematic diagram of a readout circuit, in accordance with some embodiments.

In some embodiments, the DC generator 104 comprises a single DC voltage source configured to adjust the DC voltage waveform. In other embodiments, the DC generator 104 comprises a plurality of DC voltage sources selectively coupled to the readout circuits 110 via a set of one or more switching elements and configured to adjust the DC voltage waveform applied to the comparator. For example, the DC voltage waveform has a first voltage when a first DC voltage source is coupled to one or more of the readout circuits 110, the DC voltage waveform has a second voltage when a second DC voltage source is coupled to one or more of the readout circuits 110, etc. As illustrated in FIG. 2, in some embodiments, the switching elements are comprised within respective readout circuits 110, and thus the DC voltage waveform applied to respective comparators 114 is selected based upon one or more conditions of respective readout circuits 110. For example, the voltage waveform output by the first image pixel and applied to the first comparator 114a may differ from the voltage waveform output by the second image pixel and applied to the second comparator 114b. Due to this difference in voltage waveforms output by the first image pixel and the second image pixel, at a given point in time, the first comparator 114a may be coupled to the first DC voltage source, causing the DC voltage waveform applied to the first comparator 114 to have a first voltage while the second comparator 114b may be coupled to the second DC voltage source, causing the DC voltage waveform applied to the second comparator 114 to have a second voltage.

In some embodiments, during the pixel reset level conversion and during the initial portion of the pixel signal level conversion, a first switching element couples the first DC voltage source to the comparator 114 of a readout circuit 110. When a first step up or a first step down of the voltage of the DC voltage waveform is requested, a second switching element couples the second DC voltage source to the comparator 114 of the readout circuit 110. When a second step up or a second step down of the voltage of the DC voltage waveform is requested, a third switching element couples the third DC voltage source to the comparator 114 of the readout circuit 110. The first switching element, the second switching element, and the third switching element may correspond to a same switching element or to different switching elements.

The ramp generator 106 is configured to generate a ramp voltage waveform for application, at times, to one or more of the readout circuits 110. The ramp voltage waveform has a voltage that varies over time. In some embodiments, the ramp voltage waveform varies linearly over time. In some embodiments, the ramp voltage waveform varies non-linearly over time, such as according to a first-order polynomial, a second-order polynomial, etc.

The baseline reference generator 108 is configured to generate a baseline reference voltage waveform for application, at times, to one or more of the readout circuits 110. The baseline reference voltage waveform has a substantially constant voltage over time. In some embodiments, the voltage is a function of operating characteristics of the image pixel(s) to which the comparator 114 is coupled. For example, the baseline reference generator 108 may be configured to apply a substantially constant voltage that is at least equal to a maximum voltage that the image pixels of the image array are configured to output based upon the operating characteristics of the image pixel. In some embodiments, the baseline reference generator 108 corresponds to ground and the baseline reference voltage waveform applies a voltage of approximately zero volts.

The readout circuits 110 respectively comprise the comparator 114, a counter 116, such as counters 116a-b, and a memory device 118, such as memory devices 118a-b. The comparator 114 is configured to compare a voltage waveform output by an image pixel and applied to the comparator 114 via the readout line 112 to a reference voltage waveform, where the reference voltage waveform corresponds to a voltage applied to the comparator 114 by at least one of the baseline reference generator 108, the ramp generator 106, or the DC generator 104. When the voltage waveform output by the image pixel is greater than the reference voltage waveform, the comparator 114 generates a first output corresponding to a first logic state. When the voltage waveform output by the image pixel is less than the reference voltage waveform, the comparator 114 generates a second output corresponding to a second logic state.

The counters 116 are configured to count a number of clock cycles that the comparator 114 remains at a logic state, without switching to a different logic state, after a triggering event has occurred. The memory devices 118 are configured to record the number of clock cycles that are counted by the counter 116. In some embodiments, as will be explained in further detail below with respect to FIGS. 3 and 4, the triggering event corresponds to application of a maximum voltage or a minimum voltage of the ramp voltage waveform to the comparator 114. In some embodiments, the counters 116 are clocked with a precise-frequency square wave signal.

Referring to FIG. 2, a partial schematic diagram of a readout circuit 110 in accordance with some embodiments is provided. The comparator 114 comprises two inputs. A first input 202, such as a negative input of the comparator 114, is coupled to the baseline reference generator 108 and receives a baseline reference voltage waveform.

A second input 204, such as a positive input of the comparator 114, is coupled to the DC generator 104, the ramp generator 106, and the readout line 112, to which an image pixel is coupled. In the some embodiments, the DC generator comprises a plurality of DC voltage sources 206, such as a first DC voltage source 206a and a second DC voltage source 206b. In some embodiments, the first DC voltage source 20a generates a first DC voltage waveform having a first voltage and the second DC voltage source 206b generates a second DC voltage waveform having a second voltage different than the first voltage, which are selectively applied to the second input 204. Unless otherwise noted, the phrase "DC voltage waveform" is used generically to refer to a DC voltage waveform output from the DC generator 104 and applied to the comparator 114, which can be derived from the first DC voltage source, the second DC voltage source, etc.

In some embodiments, the plurality of DC voltage sources 206 are selectively coupled to the comparator 114 via a set of one or more switching elements 208, such as 208a-b, within the readout circuit 110. In some embodiments, respective switching elements 208 comprise one or more suitable electronic switches, such as insulated gate bipolar transistors (IGBTs), bipolar junction transistors (BJTs), field-effect transistors (FETs), metal-oxide semiconductor field-effect transistors (MOSFETs), gate turnoff thyristors (GTOs), integrated gate-commutated thyristors (IGCTs), bidirectional triode thyristors (TRIACs), etc.

In some embodiments, the waveforms applied at the second input 204 are combined, such as summed, to generate a second terminal voltage applied at the second input 204. For example, the voltage waveform output by the image pixel, the ramp voltage waveform, and the DC voltage waveform are, at times, summed to yield the second terminal voltage.

In some embodiments, one or more capacitors 210, such as 210a-d, or other signal filtering elements are situated between a source of a waveform, including at least one of the baseline reference generator 108, the image pixel, the ramp generator 106, or the DC generator 104, to reduce voltage ripples associated with noise or to otherwise filter a waveform. In some embodiments, the capacitors 210 are comprised within the readout circuit 110.

The comparator 114 is configured to compare a first terminal voltage applied at the first input 202, by the baseline reference generator 108, with the second terminal voltage applied at the second input 204, from at least one of the readout line 112, the ramp generator 106, or the DC generator 104. When the second terminal voltage is greater than the first terminal voltage, the comparator 114 outputs a waveform corresponding to a first output or first logic state. When the second terminal voltage is less than the first terminal voltage, the comparator 114 outputs a waveform corresponding to a second output or second logic state, different than the first logic state.

The counter 116 is configured to count a number of clock cycles that the comparator 114 remains at a logic state, without switching to a different logic state, after a triggering event as occurred. The count, as determined by the counter 116, is output to the memory device 118 coupled to the counter 116.

Figure 3:
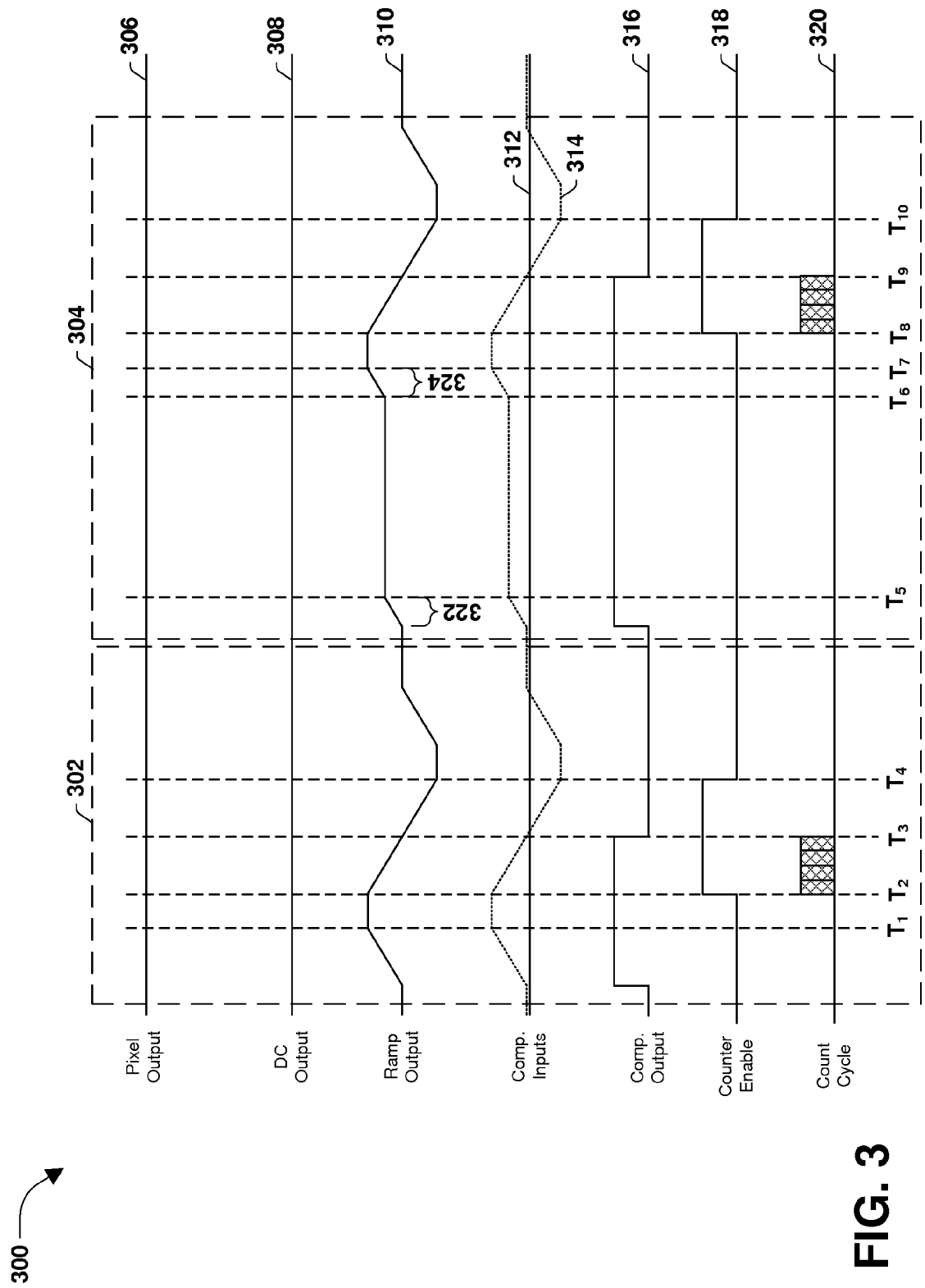
FIG. 3 is a timing diagram illustrating an operational flow of an ADC, in accordance with some embodiments.

Referring to FIG. 3, a timing diagram 300 illustrating an operational flow of an ADC 100 comprising the readout circuit 200 of FIG. 2 in accordance with some embodiments is provided. The example operational flow describes how the ADC 100 may operate when an image pixel, configured to sense visible light, senses little to no visible light during a readout period and thus experiences a dark condition.

The example operational flow is divided into two parts, a pixel reset level conversion 302 and a pixel signal level conversion 304. The pixel reset level conversion is configured to measure a voltage level on the readout line 112 after a reset voltage, or pixel reset level, has been applied to an image pixel. The pixel signal level conversion is configured to measure a voltage level on the readout line 112 when the image data, or a pixel signal level, has been applied to the readout line 112 for conversion of the voltage waveform from an analog domain to a digital domain. In some embodiments, a difference between the measurement acquired during the pixel reset level conversion and the measurement acquired during the pixel signal level conversion is computed to determine a digital value corresponding to an amount of light sensed by the image pixel during a readout period.

To define terminology illustrated in FIG. 3, pixel output corresponds to a voltage waveform 306 on the readout line 112, which during the pixel signal level conversion 304 corresponds to the voltage waveform output by the image pixel. DC output corresponds to a DC voltage waveform 308 generated by the DC generator 104. Ramp output corresponds to a ramp voltage waveform 310 generated by the ramp generator 106. Comp. inputs corresponds to voltages applied at the first input 202 and the second input 204 of the comparator 114. The solid line represents a first terminal voltage 312 applied at the first input 202 and the dotted line represents a second terminal voltage 314 applied at the second input 204. In the example arrangement of FIG. 2, the first terminal voltage 312 corresponds to the baseline reference voltage waveform and the second terminal voltage 314 corresponds to a voltage sum of the voltage waveform 306 on the readout line, the DC voltage waveform 308, and the ramp voltage waveform 310.

Comp. output corresponds to an output 316 of the comparator 114. Counter enable corresponds to a counter enable waveform 318 applied by the control component 102, for example, to enable the counter 116 to count clock cycles or to disable the counter 116 from counting clock cycles. Count cycle represents a number of clock cycles 320 that the counter 116 counts.

In some embodiments, the pixel reset level conversion 302 is initiated by a reset pulse applied to the control component 102. Responsive to receiving the reset pulse, the control component 102 instructs the baseline reference generator 108 to begin applying the baseline reference voltage waveform to the first input 202 of the comparator 114, thus causing the first terminal voltage 312 to be applied to the first input 202. Also responsive to receiving the reset pulse, the control component 102 instructs the ramp generator 106 to begin applying the ramp voltage waveform 310 to the second input 204 of the comparator 114. The DC voltage waveform 308 is applying an initial voltage to the second input 204. The second terminal voltage 314 corresponds to a sum of the voltage waveform 306 generated by the image pixel, the ramp voltage waveform 310, and the DC voltage waveform 308. In some embodiments, the initial voltage of the DC voltage waveform 308 corresponds to 0 V. In some embodiments, the initial voltage of the DC voltage waveform 308 corresponds to a non-zero value.

The ramp voltage waveform 310 varies between a minimum voltage and a maximum voltage. In some embodiments, the ramp generator 106 begins by applying a starting voltage between the minimum voltage and the maximum voltage. In some embodiments, the starting voltage corresponds to a midpoint between the minimum voltage and the maximum voltage. In some embodiments, the midpoint is selected to be a voltage that is equal to the constant voltage of the baseline reference voltage waveform.

In some embodiments, the ramp generator 106 ramps up the ramp voltage waveform 310 from the starting voltage to the maximum voltage to overcome an offset of the comparator 114 and to overcome charge injection noise due to the reset. When the second terminal voltage 314 is greater than the first terminal voltage 312, the output 316 of the comparator 114 corresponds to a first output or first logic state, such as a HIGH logic state. When the second terminal voltage 314 is less than the first terminal voltage 312, the output 316 corresponds to a second output or second logic state, such as a LOW logic state.

In some embodiments, when the ramp voltage waveform 310 reaches a maximum voltage at $T_1$, the ramp generator 106 is configured to maintain the ramp voltage waveform 310 at or near the maximum voltage for a period of time while the control component 102 prepares the counter 116 for counting. At $T_2$, the control component 102 enables the counter 116 via the counter enable waveform 318, as shown by the counter enable waveform 318 going high, and triggers the ramp generator 106 to begin decreasing the ramp voltage waveform 310 from the maximum voltage to the minimum voltage. The counter 116 begins counting clock cycles when the ramp generator 106 begins to decrease the ramp voltage waveform 310 and continues counting clock cycles until output 316 switches from the first output, or first logic state, to the second output, or second logic state, as shown at $T_3$. For example, in the illustrated timing diagram, the counter 116 counted four clock cycles 320 in the aforementioned interval between $T_2$ and $T_3$.

When the ramp voltage waveform 310 decreases to the minimum voltage, the control component 102 disables the counter 116 via the counter enable waveform 318 as shown at T4, and instructs the ramp generator 106 to return the ramp voltage waveform 310 to the starting voltage. The ramp voltage waveform 310 is held at the starting voltage for a period of time in preparation for the start of the pixel signal level conversion 304.

In some embodiments, the pixel signal level conversion 304 is initiated by a readout pulse applied to the control component 102. Responsive to receiving this readout pulse, the control component 102 instructs the ramp generator 106 to begin applying a first portion 322 of the ramp voltage waveform 310 to the second input 204 of the comparator 114, which is combined with the voltage waveform 306 applied to the readout line 112 by the image pixel to yield the second terminal voltage 314.

In some embodiments, the first portion 322 of the ramp voltage waveform 310 corresponds to voltages between the starting voltage and a cutoff voltage that is less than the maximum voltage. In some embodiments, the first portion 322 of the ramp voltage waveform 310 corresponds to voltages between the starting voltage and a midpoint between the starting voltage and the maximum voltage of the ramp voltage waveform 310.

Responsive to the ramp generator 106 applying the cutoff voltage to the second input 204 at time $T_5$, the control component 102 evaluates the output 316 of the comparator 114 to make a first determination regarding the output. When, at the first determination, the output 316 corresponds to the first output, or first logic state, and thus indicates that the second terminal voltage 314 is greater than the first terminal voltage 312, as shown in the example timing diagram 300, the ramp generator 106 maintains application of the cutoff voltage to the second input 204 for a period of time and then begins applying a second portion 324 of the ramp voltage waveform 310 to the second input 204 as shown at $T_6$.

In some embodiments, the second portion 324 of the ramp voltage waveform 310 corresponds to voltages between the cutoff voltage and the maximum voltage.

In some embodiments, when the ramp voltage waveform 310 reaches the maximum voltage at $T_7$, the ramp voltage waveform 310 is maintained at or near the maximum voltage for a period of time while the control component 102 again prepares the counter 116 for counting. At $T_8$, the control component 102 enables the counter 116 via the counter enable waveform 318 and triggers the ramp generator 106 to begin decreasing the ramp voltage waveform 310 from the maximum voltage to the minimum voltage. The counter 116 begins counting clock cycles when the ramp generator 106 begins to decrease the ramp voltage waveform 310 and continues counting clock cycles until output 316 switches from the first output, or first logic state, to the second output, or second logic state, at $T_9$. For example, in the illustrated timing diagram, the counter 116 counted four clock cycles 320 in the aforementioned interval between $T_8$ and $T_9$.

When the ramp voltage waveform 310 decreases to the minimum voltage, which occurs at $T_{10}$, the control component 102 disables the counter 116 via the counter enable waveform 318 and instructs the ramp generator 106 to return to the ramp voltage waveform 310 to the starting voltage, at which time the pixel signal level conversion 304 is complete and a digital value corresponding to an amount of light sensed by the image pixel during a readout period, can be determined based upon the clock cycles 320 counted between $T_2$ and $T_3$ and based upon the clock cycles 320 counted between $T_8$ and $T_9$. In some embodiments, the clock cycles 320 counted between $T_2$ and $T_3$ are subtracted from the clock cycles 320 counted between $T_8$ and $T_9$ or vice-versa to determine the digital value corresponding to an amount of light sensed by the image pixel during the readout period.

Because the output 316 of the comparator 114 switched between the start of the pixel signal level conversion 304 and completion of application of the first portion of the ramp signal 322 at $T_5$ when the first determination was made, the DC generator 104 did not adjust a voltage of the DC voltage waveform 308 applied to the comparator 114 during the pixel signal level conversion 304.

Figure 4:
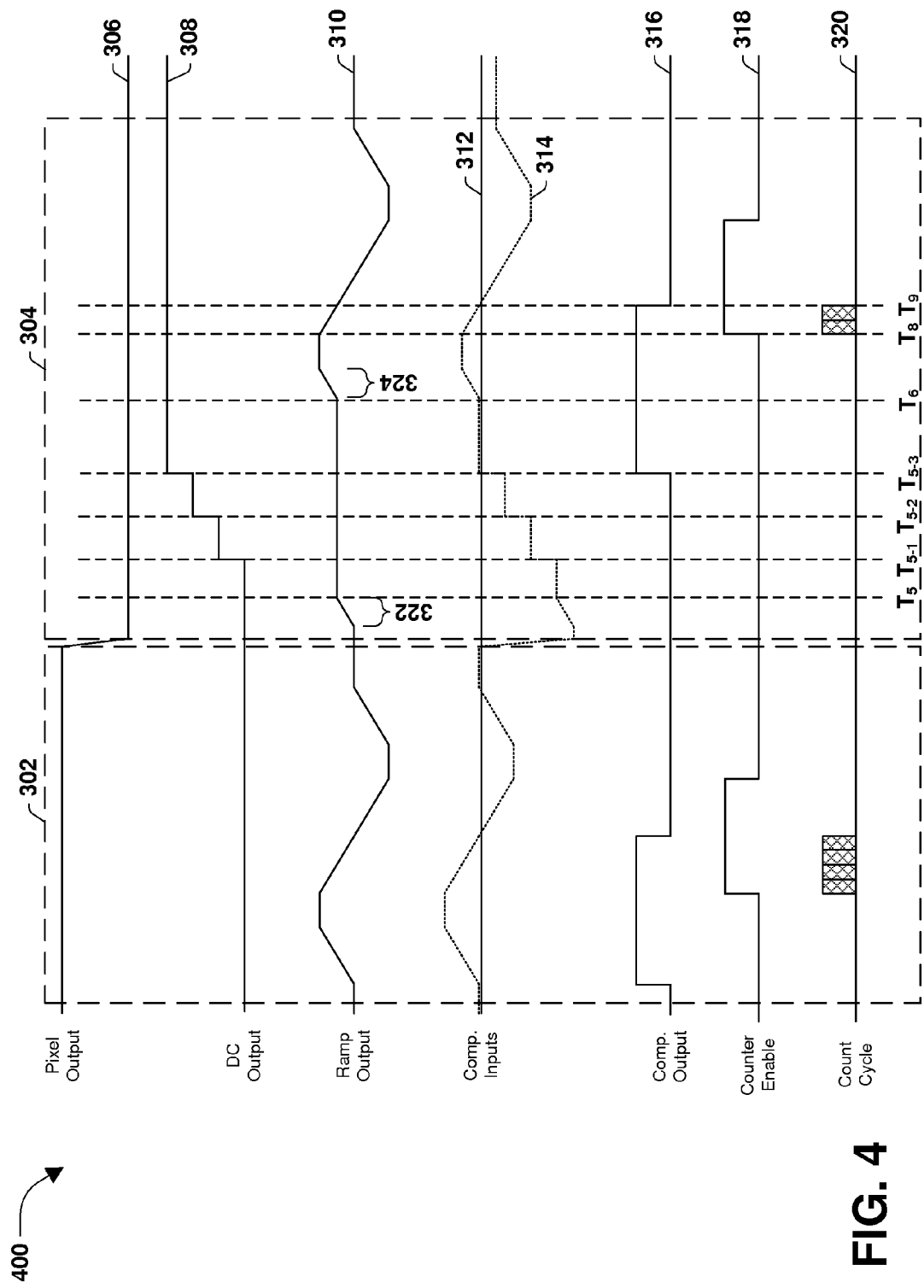
FIG. 4 is a timing diagram illustrating an operational flow of an ADC, in accordance with some embodiments.

Referring to FIG. 4, a second timing diagram 400 illustrating an operational flow of an ADC 100 comprising the readout circuit 200 of FIG. 2 in accordance with some embodiments is provided. The example operational flow describes how the ADC 100 may operate when an image pixel, configured to sense visible light, senses visible light during a readout period.

The example operational flow is divided into two parts, a pixel reset level conversion 302 and a pixel signal level conversion 304. For purposes of brevity, features of the second timing diagram 400 that are similar to features of the timing diagram 300 are not described in detail again.

In the second timing diagram 400, the voltage waveform 306 corresponding to the voltage on the readout line 112 decreases at the beginning of the pixel signal level conversion 304 because the image pixel that is being readout sensed light causing a drop in voltage potential at the image pixel. Thus, the image pixel applied a voltage to the readout line 112 at the beginning of the pixel signal level conversion 304 that caused a decrease in the voltage waveform 306 on the readout line 112.

As a result of this decrease in the voltage waveform 306, at $T_5$ when the first determination regarding the output 316 is made, the first terminal voltage 312 is greater than the second terminal voltage 314 and thus the output 316 of the comparator 114 corresponds to a second output or second logic state, such as a LOW logic state. When the output 316 corresponds to the second output, or second logic state, and thus indicates that the first terminal voltage 312 is greater than the second terminal voltage 314, as shown in the second timing diagram 400, the control component 102 is configured to instruct the ramp generator 106 to maintain the cutoff voltage and instruct the DC generator 104 to step up a voltage of the DC voltage waveform 308 at $T_{5-1}$. The stepped-up voltage of the DC voltage waveform 308 is combined with the voltage waveform 306 and the ramp voltage waveform 306, causing the second terminal voltage 314 to increase. In some embodiments, a delay is introduced between the first determination at $T_5$ and stepping up the voltage of the DC voltage waveform 308 at $T_{5-1}$ to allow the comparator 114 to settle. In some embodiments, where a settling time of the comparator 114 is negligible, the voltage of the DC voltage waveform 308 is stepped up at $T_{5-1}$ instead of $T_{5-1}$.

Responsive to the voltage of the DC voltage waveform being stepped up, a second determination is made regarding the output 316 of the comparator 114 at $T_{5-1}$. When the output 316 at $T_{5-1}$ corresponds to the second output, or second logic state, and thus indicates that the first terminal voltage 312 is still greater than the second terminal voltage 314, as shown in the second timing diagram 400, the control component 102 is configured to instruct the DC generator 104 to step up the voltage of the DC voltage waveform 308 again, as shown at $T_{6-2}$. Such a process is repeated until the output 316 corresponds to the first output, or first logic state, and thus indicates that the second terminal voltage 314 is greater than the first terminal voltage 312, such as occurs at $T_{5-3}$ in the second timing diagram 400.

When the output 316 corresponds to the first output, or first logic state, and thus indicates that the second terminal voltage 314 is greater than the first terminal voltage 312, the control component 102 is configured to instruct the DC generator 104 to maintain the DC voltage waveform 308 at the present voltage. Thereafter, the control component 102 instructs the ramp generator 106 to begin applying the second portion 324 of the ramp voltage waveform 310 to the second input 204, which occurs at $T_6$ in the second timing diagram 400.

As with the timing operation 300 of FIG. 3, the counter 116 begins counting clock cycles at $T_8$ when the ramp generator 106 begins to decrease the ramp voltage waveform 310 and continues counting clock cycles until the output 316 of the comparator 114 switches from the first output to the second output, which occurs at $T_9$ in the second timing diagram. For example, in the illustrated timing diagram, the counter 116 counted two clock cycles 320 in the aforementioned interval between $T_8$ and $T_9$.

The memory device 118 is configured to store a digital value corresponding to an amount of light sensed by the image pixel during a readout period. The digital value is determined based upon the count acquired during the pixel reset level conversion, the count acquired during the pixel signal level conversion, and the number of times the DC generator 104 stepped up the DC voltage waveform 308. For example, 1 step may be equivalent to 10 clock cycles in a predefined lookup table and thus the digital value corresponds to a digital equivalent of 28 clock cycles because in the second timing diagram 400, the DC voltage waveform 308 was stepped up 3 times and the counter 116 counted four clock cycles during the pixel reset level conversion and counted two clock cycles during the pixel signal level conversion ((3*10+2)−(4)=28).

Figure 5:
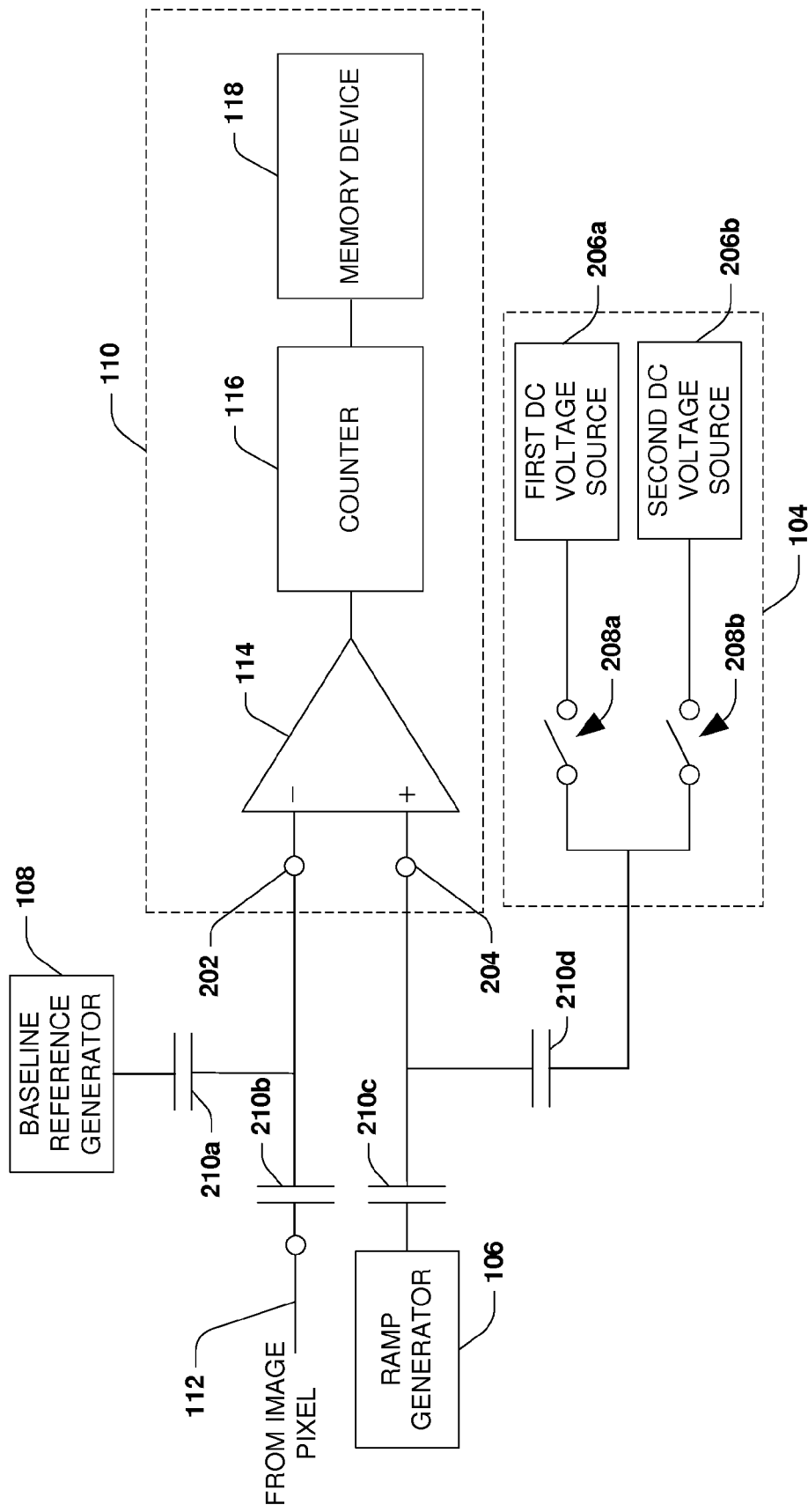
FIG. 5 is a partial schematic diagram of a readout circuit, in accordance with some embodiments.

Referring to FIG. 5, a partial schematic diagram of a readout circuit 110 in accordance with some embodiments is provided. In this example arrangement, the readout line 112 and the baseline reference generator 108 are coupled to the first input 202 of the comparator 114 and the ramp generator 106 and the DC generator 104 are coupled to the second input 204 of the comparator 114. In such an arrangement, the first terminal voltage applied at the first input 202 corresponds a combined voltage of the voltage waveform on the readout line 112 and the baseline reference voltage waveform. The second terminal voltage applied at the second input 204 corresponds to a combined voltage of the ramp voltage waveform and the DC voltage waveform.

Figure 6:
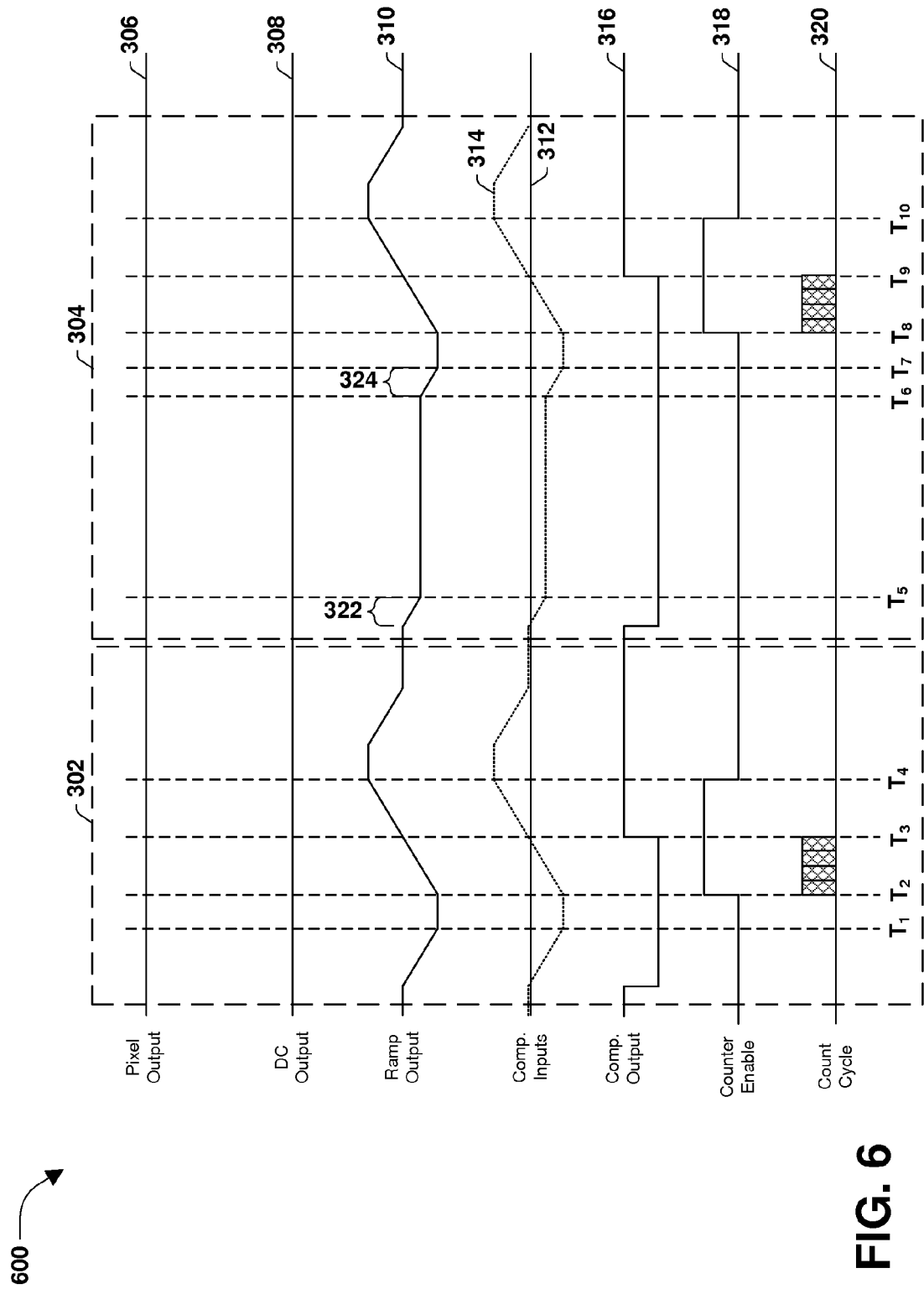
FIG. 6 is a timing diagram illustrating an operational flow of an ADC, in accordance with some embodiments.

Referring to FIG. 6, a timing diagram 600 illustrating an operational flow of an ADC 100 comprising the readout circuit 500 of FIG. 5 in accordance with some embodiments is provided. The example operational flow describes how the ADC 100 may operate when an image pixel, configured to sense visible light, senses little to no visible light during a readout period and thus experiences a dark condition.

The timing diagram 600 is similar to the timing diagram 300 of FIG. 3 with a few differences. For example, the ramp voltage waveform 310 of the timing diagram 600 is inverted relative to the ramp voltage waveform 310 of timing diagram 300 of FIG. 3. This distinction causes the first portion 322 of the ramp voltage waveform 310 to have a decreasing slope, where the starting voltage is greater than the cutoff voltage and the cutoff voltage is between the starting voltage and a minimum voltage. This distinction also causes the second portion 324 of the ramp voltage waveform 310 to have a decreasing slope between the cutoff voltage and the minimum voltage. As another distinction, the counter 116 is configured to count during an interval when the output 316 of the comparator 114 corresponds to a second output, or second logic state, such as a low logic state. As yet another distinction, the counter 116 is configured to count during an interval when the ramp voltage waveform 310 is increasing from the minimum voltage.

Figure 7:
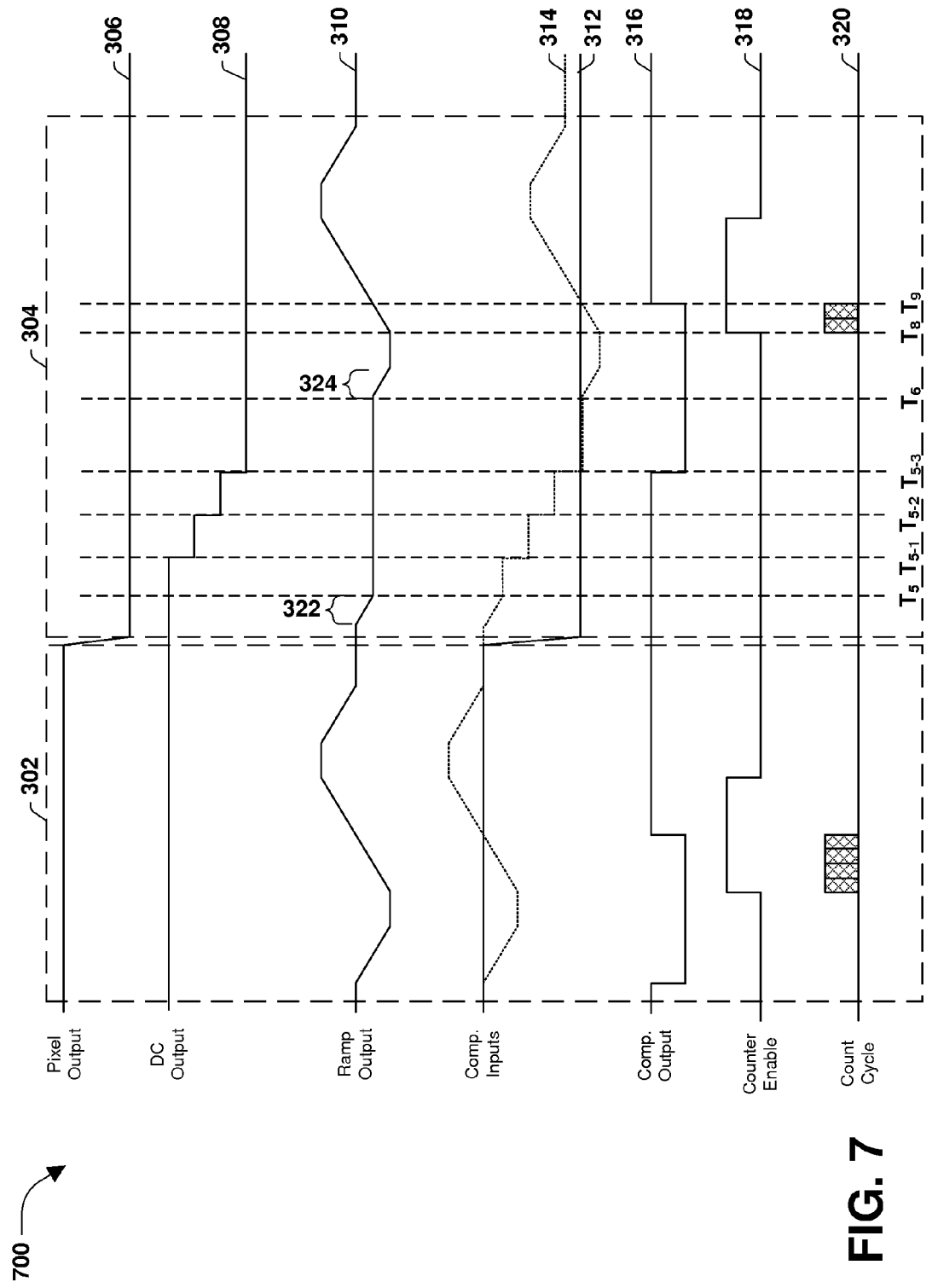
FIG. 7 is a timing diagram illustrating an operational flow of an ADC, in accordance with some embodiments.

Referring to FIG. 7, a second timing diagram 700 illustrating an operational flow of an ADC 100 comprising the readout circuit 500 of FIG. 5 and in accordance with some embodiments is provided. The example operational flow describes how the ADC 100 may operate when an image pixel, configured to sense visible light, senses visible light during a readout period.

The second timing diagram 700 is similar to the timing diagram 400 of FIG. 4 with a few differences. For example, the DC voltage waveform 308 and the ramp voltage waveform 310 of the second timing diagram 700 are inverted relative to the DC voltage waveform 308 and the ramp voltage waveform 310 of the second timing diagram 400 FIG. 4. The inversion of the ramp voltage waveform 310 causes the first portion 322 of the ramp voltage waveform 310 to have a decreasing slope, where the starting voltage is greater than the cutoff voltage and the cutoff voltage is between the starting voltage and a minimum voltage. The inversion also causes the second portion 324 of the ramp voltage waveform 310 to have a decreasing slope between the cutoff voltage and the minimum voltage.

As another distinction, voltage waveform 306 is combined with the baseline reference voltage to yield the first terminal voltage 312. As yet another distinction, the counter 116 is configured to count during an interval when the output 316 of the comparator 114 corresponds to a second output, or second logic state, such as a LOW logic state, and the control component 102 is configured to instruct the DC generator 104 to step-down the DC voltage waveform 308 responsive to the output 316 of the comparator corresponding to the first output, or first logic state, such as a HIGH logic state, at the first determination, second determination, etc. As still another distinction, the counter 116 is configured to count during an interval when the ramp voltage waveform 310 is increasing from the minimum voltage.

Figure 8:
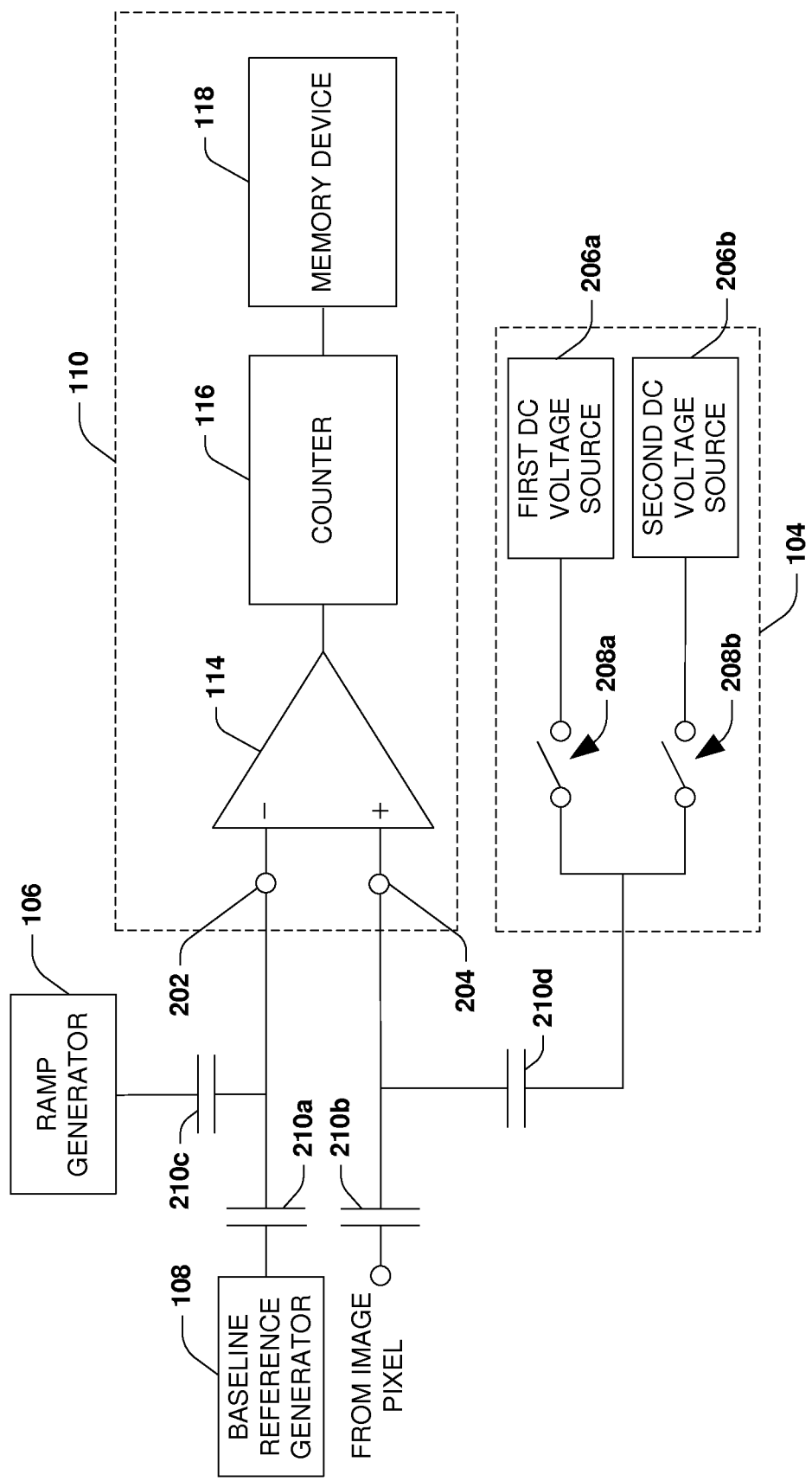
FIG. 8 is a partial schematic diagram of a readout circuit, in accordance with some embodiments.

Referring to FIG. 8, a partial schematic diagram of a readout circuit 110 in accordance with some embodiments is provided. In this example arrangement, the baseline reference generator 108 and the ramp generator 106 are coupled to the first input 202 of the comparator 114, and the readout line 112 and the DC generator 104 are coupled to the second input 204 of the comparator 114. In such an arrangement, the first terminal voltage applied at the first input 202 corresponds to a combined voltage of the baseline reference voltage waveform and the ramp voltage waveform. The second terminal voltage applied at the second input 204 corresponds to a combined voltage of the voltage waveform on the readout line 112 and the DC voltage waveform.

Figure 9:
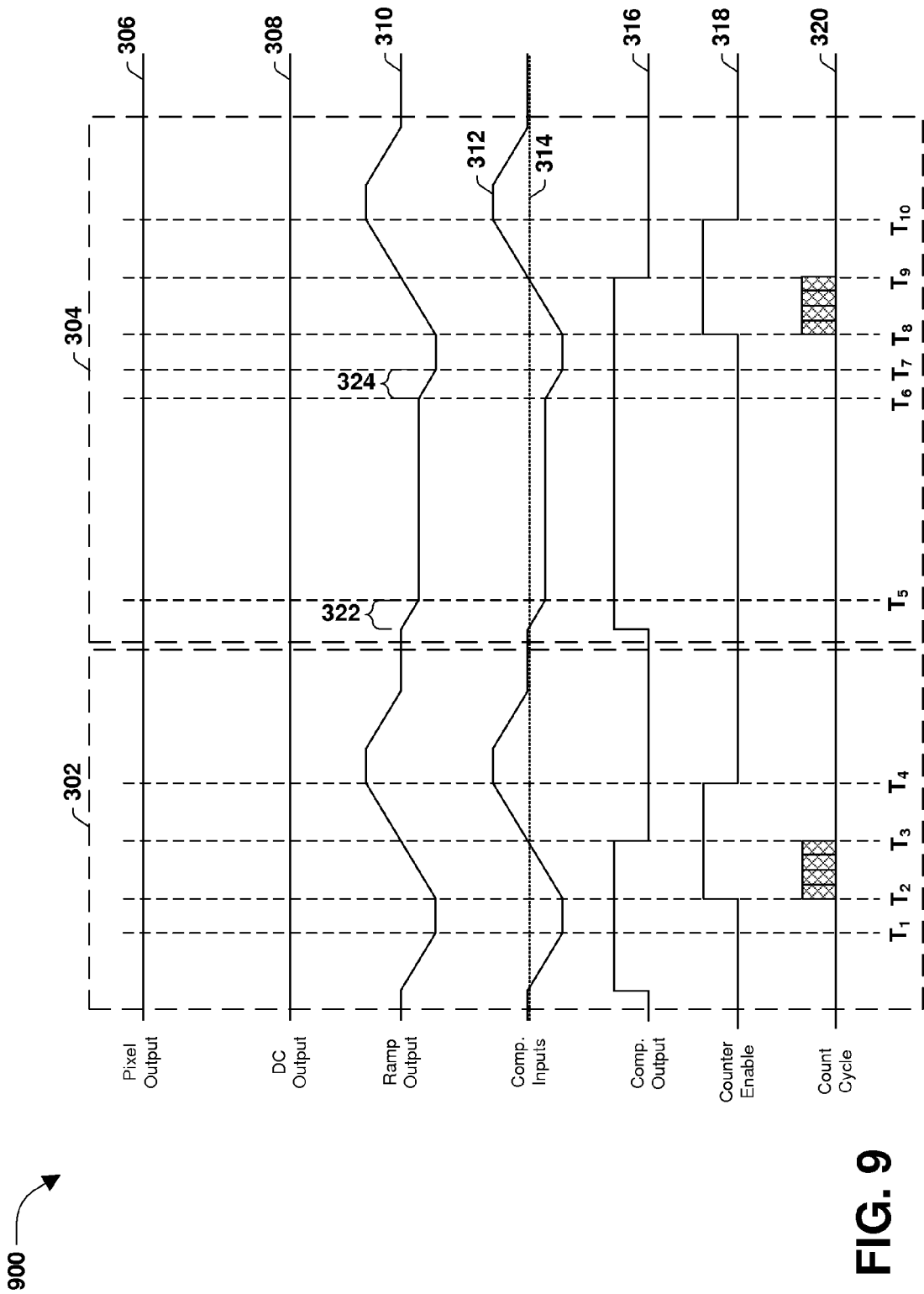
FIG. 9 is a timing diagram illustrating an operational flow of an ADC, in accordance with some embodiments.

Referring to FIG. 9, a timing diagram 900 illustrating an operational flow of an ADC 100 comprising the readout circuit 800 of FIG. 8 in accordance with some embodiments is provided. The example operational flow describes how the ADC 100 may operate when an image pixel, configured to sense visible light, senses little to no visible light during a readout period and thus experiences a dark condition.

The timing diagram 900 is similar to the timing diagram 600 of FIG. 3 with a few differences. For example, the ramp voltage waveform 310 of the timing diagram 900 is inverted relative to the ramp voltage waveform 310 of timing diagram 300 of FIG. 3. This distinction causes the first portion 322 of the ramp voltage waveform 310 to have a decreasing slope, where the starting voltage is greater than the cutoff voltage and the cutoff voltage is between the starting voltage and a minimum voltage. This distinction also causes the second portion 324 of the ramp voltage waveform 310 to have a decreasing slope between the cutoff voltage and the minimum voltage. As another distinction, the first terminal voltage 312 varies over the interval represented by the timing diagram 900 while the second terminal voltage 314 is substantially constant due the ramp voltage waveform 310 being applied to the first input 202 instead of the second input 204. As yet another distinction, the counter 116 is configured to count during an interval when the ramp voltage waveform 310 is increasing from the minimum voltage.

Figure 10:
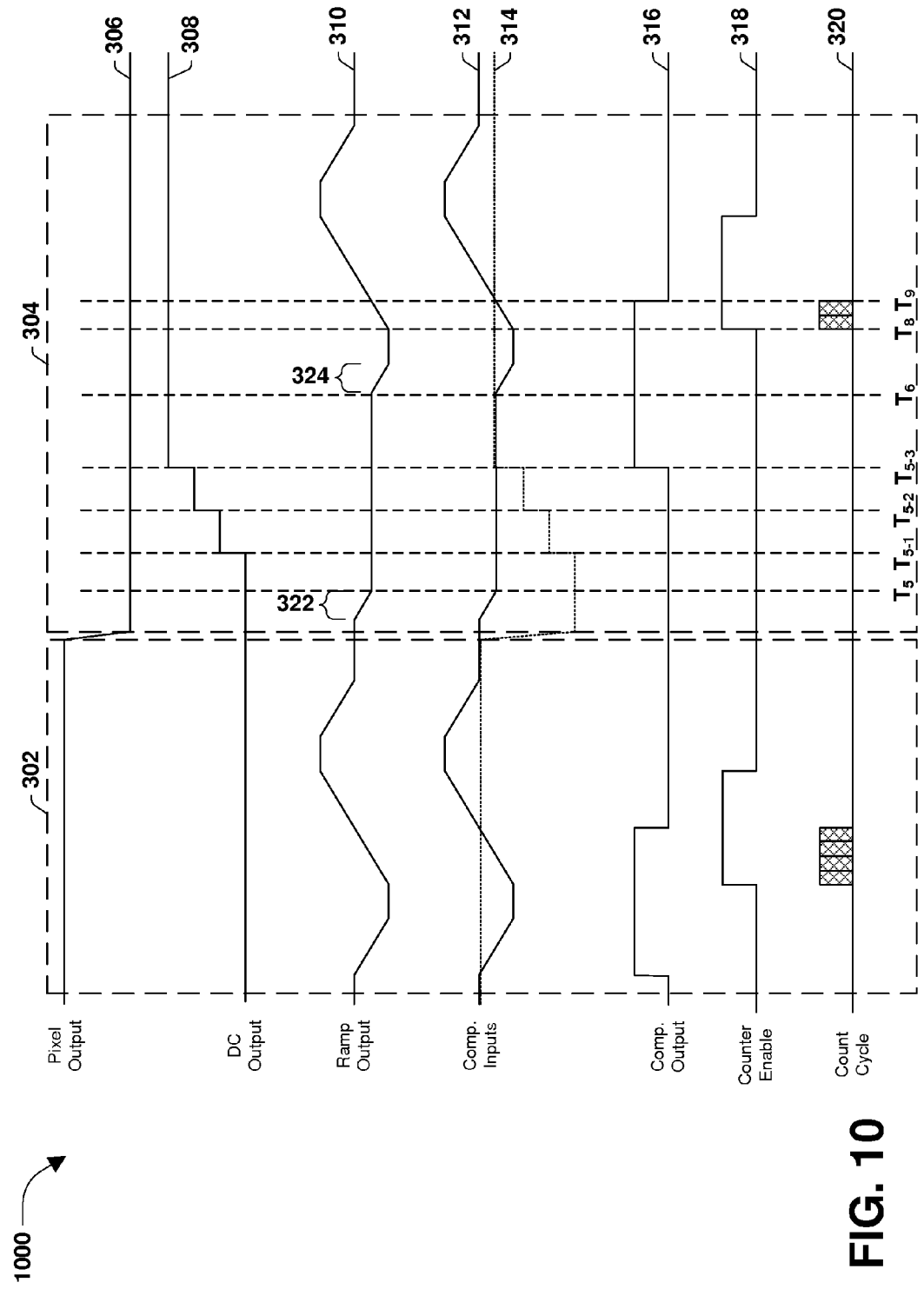
FIG. 10 is a timing diagram illustrating an operational flow of an ADC, in accordance with some embodiments.

Referring to FIG. 10, a second timing diagram 700 illustrating an operational flow of an ADC 100 comprising the readout circuit 800 of FIG. 8 in accordance with some embodiments is provided. The example operational flow describes how the ADC 100 may operate when an image pixel, configured to sense visible light, senses visible light during a readout period.

The timing diagram 1000 is similar to the timing diagram 400 of FIG. 4 with a few differences. For example, the ramp voltage waveform 310 of the timing diagram 1000 is inverted relative to the ramp voltage waveform 310 of the second timing diagram 400 FIG. 4. The inversion of the ramp voltage waveform 310 causes the first portion 322 of the ramp voltage waveform 310 to have a decreasing slope, where the starting voltage is greater than the cutoff voltage and the cutoff voltage is between the starting voltage and a minimum voltage. The inversion also causes the second portion 324 of the ramp voltage waveform 310 to have a decreasing slope between the cutoff voltage and the minimum voltage.

As another distinction, the ramp voltage waveform 310 is combined with the baseline reference voltage to yield the first terminal voltage 312 and the voltage waveform 306 is combined with the DC voltage waveform 308 to yield the second terminal voltage 314. Thus, application of the first portion 322 of the ramp voltage waveform 310 decreases the first terminal voltage 312 while a step-up in the DC voltage waveform 308 increases the second terminal voltage 314. As yet another distinction, the counter 116 is configured to count during an interval when the ramp voltage waveform 310 is increasing from the minimum voltage.

Figure 11:
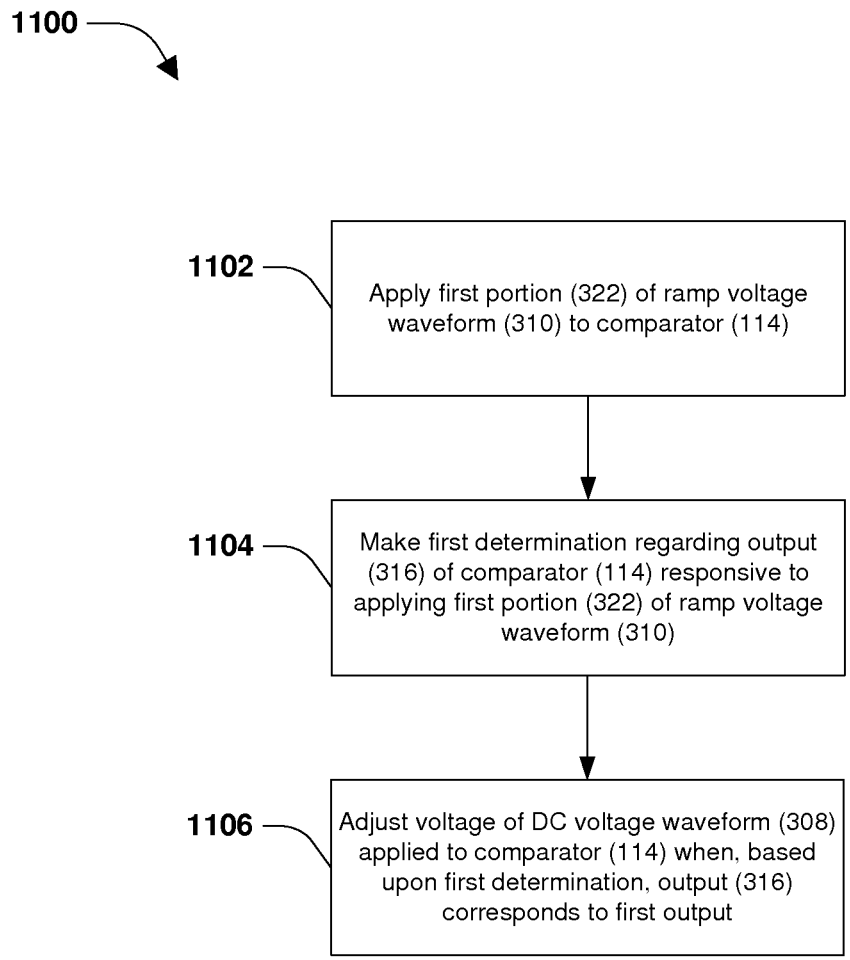
FIG. 11 is a flow diagram illustrating a method for analog-to-digital conversion, in accordance with some embodiments.

Referring to FIG. 11, a flow diagram illustrating a method 1100 for an analog-to-digital conversion in accordance with some embodiments is provided. The method 1100 comprises applying a first portion of a ramp voltage waveform to a comparator at 1102 and making a first determination regarding an output of the comparator at 1104 responsive to the applying a first portion of the ramp voltage waveform. The method 1100 also comprises adjusting a voltage of a DC voltage waveform applied to the comparator at 1106 when, based upon the first determination, the output corresponds to the first output.

Figure 12:
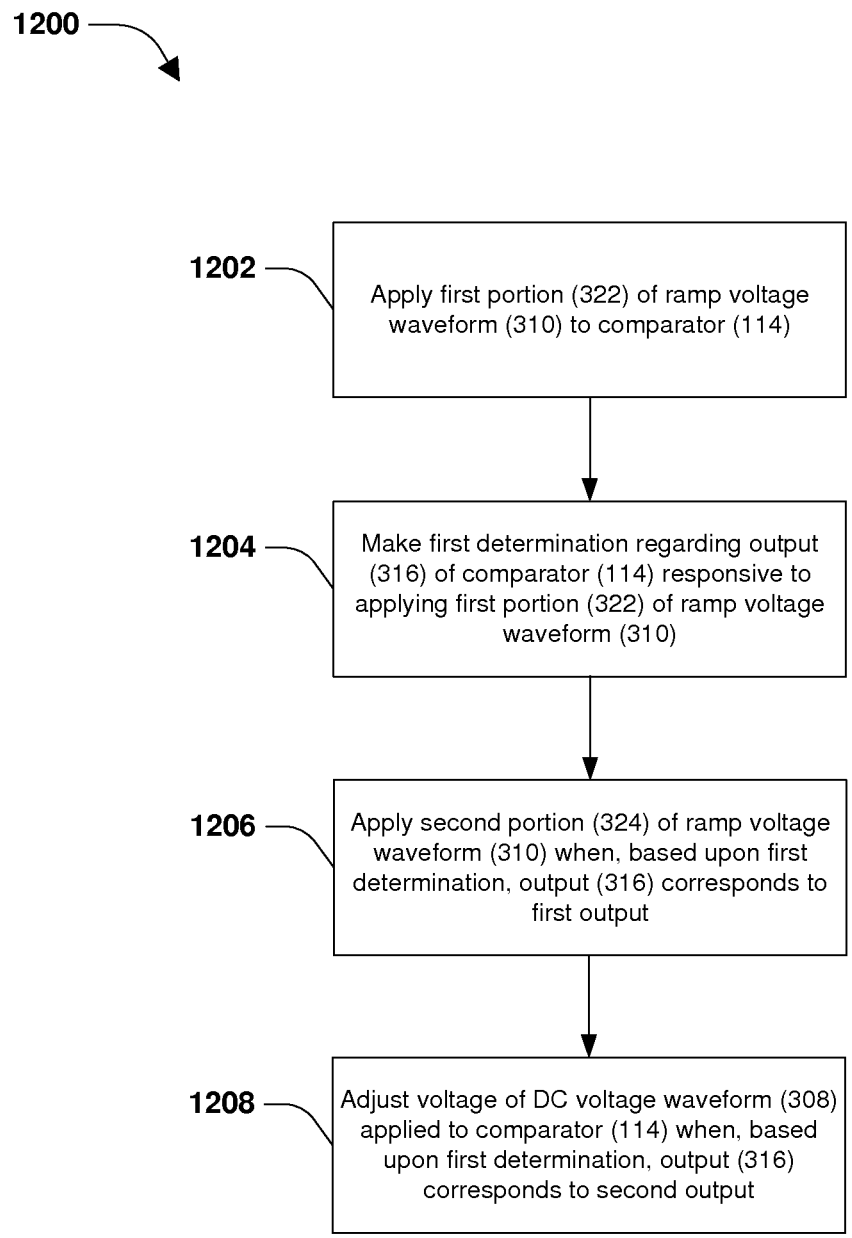
FIG. 12 is a flow diagram illustrating a method for analog-to-digital conversion, in accordance with some embodiments.

Referring to FIG. 12, a flow diagram illustrating a method 1200 for an analog-to-digital conversion in accordance with some embodiments is provided. The method 1200 comprises applying a first portion of a ramp voltage waveform to a comparator at 1202 and making a first determination regarding an output of the comparator at 1204 responsive to the applying a first portion of the ramp voltage waveform. When, based upon the first determination, the output corresponds to a first output, a second portion of the ramp voltage waveform is applied to the comparator at 1206. When, based upon the first determination, the output corresponds to a second output, different than the first output, the method 1200 comprises adjusting a voltage of a DC voltage waveform applied to the comparator at 1208.

Figure 13:
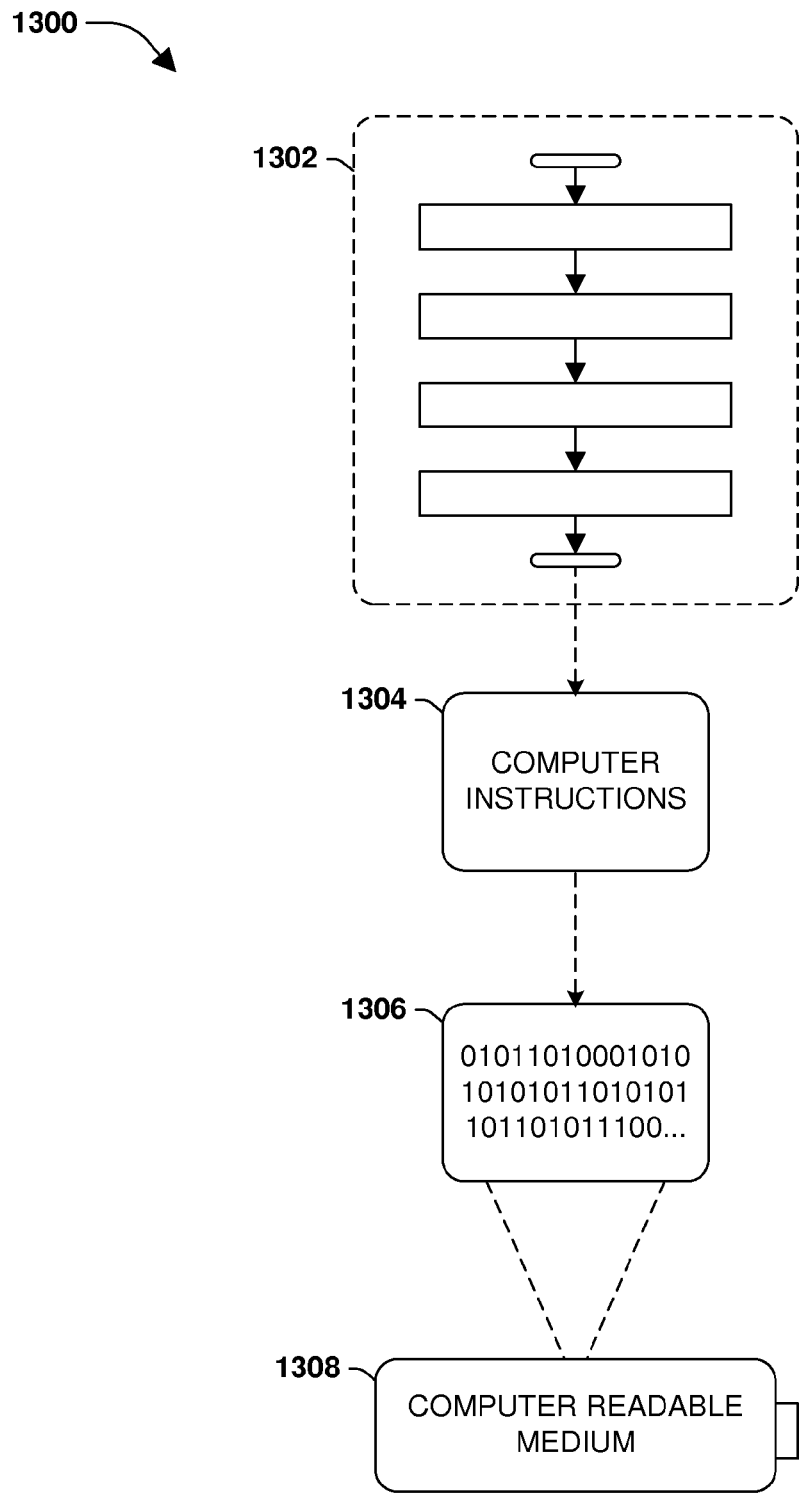
FIG. 13 is an illustration of an example computer-readable medium or computer-readable device comprising processor-executable instructions configured to embody one or more of the provisions set forth herein, in accordance with some embodiments.

Still another embodiment involves a computer-readable medium comprising processor-executable instructions configured to implement one or more of the techniques presented herein. An example embodiment of a computer-readable medium or a computer-readable device is illustrated in FIG. 13, wherein the implementation 1300 comprises a computer-readable medium 1308, such as a CD-R, DVD-R, flash drive, a platter of a hard disk drive, etc., on which is encoded computer-readable data 1306. This computer-readable data 1306, such as binary data comprising at least one of a zero or a one, in turn comprises a set of processor-executable instructions 1304 configured to operate according to one or more of the principles set forth herein when executed by a processor. In some embodiments, the processor-executable instructions 1304 are configured to perform a method 1302, such as at least some of at least one of the method 1100 of FIG. 11 or the method 1200 of FIG. 12. In some embodiments, the processor-executable instructions 1304 are configured to implement a system, such as at least some the example ADC 100 of FIG. 1. Many such computer-readable media are devised by those of ordinary skill in the art that are configured to operate in accordance with the techniques presented herein.

In some embodiments, a method for analog-to-digital conversion is provided. The method comprises applying a first portion of a ramp voltage waveform to a comparator and making a first determination regarding an output of the comparator responsive to the applying a first portion of a ramp voltage waveform. When, based upon the first determination, the output corresponds to a first output, a second portion of the ramp voltage waveform is applied to the comparator. When, based upon the first determination, the output corresponds to a second output different than the first output, a voltage of a DC voltage waveform that is applied to the comparator is adjusted.

In some embodiments, an ADC is provided. The ADC comprises a comparator and a ramp generator coupled to an input of the comparator and configured to generate a ramp voltage waveform. The ADC also comprises a control component coupled to an output of the comparator. The control component is configured to initiate application of a first portion of the ramp voltage waveform to the comparator, make a first determination regarding an output of the comparator responsive to the first portion of the ramp voltage waveform being applied the comparator, and initiate adjustment of a voltage of a DC voltage waveform applied to the comparator when, based upon the first determination, the output corresponds to a first output.

In some embodiments, a method is provided. The method comprises applying a first portion of a ramp voltage waveform to a comparator and making a first determination regarding an output of the comparator responsive to the applying a first portion of a ramp voltage waveform. The method also comprises adjusting a voltage of a direct current DC voltage waveform applied to the comparator when, based upon the first determination, the output corresponds to a first output.

The foregoing outlines features of several embodiments so that those of ordinary skill in the art may better understand various aspects of the present disclosure. Those of ordinary skill in the art should appreciate that they may readily use the present disclosure as a basis for designing or modifying other processes and structures for carrying out the same purposes and/or achieving the same advantages of various embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first element and a second element generally correspond to element A and element B or two different or two identical elements or the same element.

Also, although the disclosure has been shown and described with respect to one or more implementations, equivalent alterations and modifications will occur to others of ordinary skill in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function of the described component (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A method for analog-to-digital conversion, comprising:
applying a first portion of a ramp voltage waveform to a comparator;
making a first determination regarding an output of the comparator responsive to the applying a first portion of a ramp voltage waveform;
when, based upon the first determination, the output corresponds to a first output:
applying a second portion of the ramp voltage waveform to the comparator; and
when, based upon the first determination, the output corresponds to a second output different than the first output:
adjusting a voltage of a direct current (DC) voltage waveform applied to the comparator.

2. The method of claim 1, comprising:
making a second determination regarding the output of the comparator responsive to the adjusting; and
when, based upon the second determination, the output corresponds to the first output:
applying the second portion of the ramp voltage waveform to the comparator.

3. The method of claim 2, comprising:
when, based upon the second determination, the output corresponds to the second output:
adjusting, again, the voltage of the DC voltage waveform.

4. The method of claim 1, the applying a first portion of a ramp voltage waveform to a comparator, comprising:
combining the first portion of the ramp voltage waveform with a voltage waveform output by an image pixel to generate a first terminal voltage; and
applying the first terminal voltage to a first input of the comparator.

5. The method of claim 1, comprising:
combining the first portion of the ramp voltage waveform, a voltage waveform output by an image pixel, and the DC voltage waveform to generate a first terminal voltage; and
applying the first terminal voltage to a first input of the comparator.

6. The method of claim 1, wherein the first portion of the ramp voltage waveform is applied to a first input of the comparator, and the method comprises:
applying a voltage waveform output by an image pixel to a second input of the comparator, the second input different than the first input.

7. The method of claim 6, comprising:
combining the first portion of the ramp voltage waveform with the DC voltage waveform to generate a first terminal voltage; and
applying the first terminal voltage to the first input of the comparator.

8. The method of claim 7, the applying a voltage waveform, comprising:
combining the voltage waveform with a baseline reference waveform to generate a second terminal voltage different than the first terminal voltage; and
applying the second terminal voltage to the second input of the comparator.

9. The method of claim 1, the applying a first portion of a ramp voltage waveform to a comparator, comprising:
combining the first portion of the ramp voltage waveform with a baseline reference waveform to generate a first terminal voltage; and
applying the first terminal voltage to a first input of the comparator.

10. The method of claim 9, comprising:
combining the first DC voltage waveform with a voltage waveform output by an image pixel to generate a second terminal voltage; and
applying the second terminal voltage to a second input of the comparator different than the first input.

11. The method of claim 1, comprising:
identifying a maximum voltage of the second portion of the ramp voltage waveform; and
counting clock cycles that lapse between the maximum voltage and a change in the output of the comparator.

12. The method of claim 1, comprising:
identifying a minimum voltage of the second portion of the ramp voltage waveform; and
counting clock cycles that lapse between the minimum voltage and a change in the output of the comparator.

13. The method of claim 1, comprising:
performing a pixel level reset prior to the applying a first portion of a ramp voltage waveform, the performing comprising:
applying the ramp voltage waveform to the comparator.

14. An analog-to-digital converter (ADC), comprising:
a comparator;
a ramp generator coupled to an input of the comparator and configured to generate a ramp voltage waveform; and
a control component coupled to an output of the comparator and configured to:
initiate application of a first portion of the ramp voltage waveform to the comparator;
make a first determination regarding an output of the comparator responsive to the first portion of the ramp voltage waveform being applied the comparator; and
initiate adjustment of a voltage of a direct current (DC) voltage waveform applied to the comparator when, based upon the first determination, the output corresponds to a first output.

15. The ADC of claim 14, the control component configured to:
initiate application of a second portion of the ramp voltage waveform to the comparator when, based upon the first determination, the output corresponds to a second output different than the first output.

16. The ADC of claim 15, comprising:
a counter configured to:
identify at least one of a maximum voltage or a minimum voltage of the second portion of the ramp voltage waveform; and
count clock cycles that lapse between the at least one of a maximum voltage or a minimum voltage and a change in the output of the comparator.

17. The ADC of claim 14, the control component configured to:
make a second determination regarding the output of the comparator responsive to the voltage of the DC voltage waveform being adjusted; and
initiate a second adjustment of the voltage of the DC voltage waveform when, based upon the second determination, the output corresponds to the first output.

18. The ADC of claim 17, comprising:
a first DC voltage source configured to adjust the voltage of the DC voltage waveform when, based upon the first determination, the output corresponds to a first output;
a second DC voltage source configured to adjust the voltage of the DC voltage waveform when, based upon the second determination, the output corresponds to the first output; and
a switching element configured to:
couple the first DC voltage source to the comparator responsive to the control component initiating the adjustment of the voltage of the DC voltage waveform; and
couple the second DC voltage source to the comparator responsive to the control component initiating the second adjustment of the voltage of the DC voltage waveform.

19. The ADC of claim 17, the control component configured to:
initiate application of a second portion of the ramp voltage waveform to the comparator when, based upon the second determination, the output corresponds to a second output different than the first output.

20. A method, comprising:
applying a first portion of a ramp voltage waveform to a comparator;
making a first determination regarding an output of the comparator responsive to the applying a first portion of a ramp voltage waveform; and adjusting a voltage of a direct current (DC) voltage waveform applied to the comparator when, based upon the first determination, the output corresponds to a first output.

* * * * *